__United States Patent__ [19]

McEwan

[11] Patent Number: 5,422,607
[45] Date of Patent: Jun. 6, 1995

[54] LINEAR PHASE COMPRESSIVE FILTER

[75] Inventor: Thomas E. McEwan, Livermore, Calif.

[73] Assignee: The Regents of the University of California, Oakland, Calif.

[21] Appl. No.: 194,025

[22] Filed: Feb. 9, 1994

[51] Int. Cl.⁶ .............................................. H03K 3/313
[52] U.S. Cl. ...................................... 333/20; 333/174; 327/100
[58] Field of Search ................... 333/20, 139, 140, 164, 333/156, 174; 307/260, 280, 281, 282, 268, 263, 285, 320; 328/65; 327/100

[56] References Cited

U.S. PATENT DOCUMENTS 3,882,431  5/1975  Hopwood et al. .................. 333/139
5,014,018  5/1991  Rodwell et al. ..................... 333/20
5,023,574  6/1991  Anklam et al. ....................... 333/20
5,302,922  4/1994  Heidemann et al. ............ 333/164 X Primary Examiner—Seungsook Ham
Attorney, Agent, or Firm—Henry P. Sartorio; John P. Wooldridge

[57] ABSTRACT

A phase linear filter for soliton suppression is in the form of a laddered series of stages of non-commensurate low pass filters with each low pass filter having a series coupled inductance (L) and a reverse biased, voltage dependent varactor diode, to ground which acts as a variable capacitance (C). L and C values are set to levels which correspond to a linear or conventional phase linear filter. Inductance is mapped directly from that of an equivalent nonlinear transmission line and capacitance is mapped from the linear case using a large signal equivalent of a nonlinear transmission line.

11 Claims, 1 Drawing Sheet

LINEAR PHASE COMPRESSIVE FILTER

The United States Government has rights in this invention pursuant to Contract No. W-7405-ENG-48 between the United States Department of Energy and the University of California for the operation of Lawrence Livermore National Laboratory.

BACKGROUND OF THE INVENTION

Field of the Invention

The present invention relates to shock lines and nonlinear transmission lines (NLTLs) and more specifically to varactor diode loaded shock lines. In particular, the invention describes a method and circuit for pulse sharpening by pulse filtering and thereby damping self sustained soliton ringing components normally encountered due to the nonlinearity of the transmission line.

Description of Related Art

Shock lines and NonLinear Transmission Lines were conceived and have been in use for over half a century in this country. Until recently, application of the NLTL has been confined primarily to magnetic pulse compressors; however, more recent applications have led to pulse shapers, compressors, and pulse filters.

In a typical NLTL, a number of inductor-capacitor (LC) stages are coupled in a series of stages, wherein each LC stage comprises an inductor in series with the next stage with a capacitor to ground in each stage. Recent developments have brought rise to a new class of NLTL wherein the capacitors to ground are replaced with reverse biased, varactor diodes which act as variable capacitors with capacitance dependent on voltage applied. Initially, with no signal across the varactors, the depletion layer across the PN junction of each individual diode is at a minimum which correlates to a minimum gap between effective capacitor plates and therefore a maximum capacitance for each varactor cell or stage. When a negative, reverse bias voltage is applied to the varactor, the depletion layer of the PN junction is widened, which effectively decreases the capacitance of each respective varactor. Therefore, as a negative input signal/pulse rises across the NLTL, the reverse bias voltage causes each varactor cell to experience an initial large capacitance which, as the capacitance varies with voltage across the diode, rapidly diminishes to a minimum capacitance in accordance with a varying and decreasing time constant per stage given by the square root of inductance times capacitance $(LC)^{\frac{1}{2}}$.

Since the voltage related capacitance diminishes per stage, so too does the indirectly related time constant. The incoming voltage pulse drop is effectively delayed a little longer in each succeeding stage before dropping to a minimum level due to the inherent maximum capacitive effect of the respective varactor whose capacitance diminishes as the reverse voltage across it increases in time. The NLTL thereby in effect acts as a nonlinear low pass ladder line filter to shape, sharpen and yield a single steep output pulse.

Varactor NLTL work has been conducted at Stanford University and Hewlett Packard (HP) resulting in generation of very fast, all electric transients in such NLTLs. A major problem, however, with existing NLTLs is that the waveform that shock lines produce when driven into shock almost always contains a form of ringing known as solitons. Solitons are, in effect, the ringing components that are self sustained by the nonlinearity of the line. HP recently developed a technique to suppress ringing on a NLTL disclosed in U.S. Pat. No. 4,855,696 by Tan, et al. The HP technique involved the use of damping, or Q spoiling, resistors and combinations of various diode types which yielded various capacitance-voltage (CV) profiles. A central problem with the HP technique is that the process is not readily compatible with integrated circuit processing because the CV profile is generally set on a wafer scale by conventional manufacturing processes. Therefore, individual diodes on the same wafer cannot conveniently have different CV profiles. In addition, the integration of damping resistors adds processing steps to a monolithic NLTL, and resistive damping is a power robbing method to control ringing. The signal would be substantially attenuated at the output.

Existing art high performance NLTLs produce so much ringing that such lines are usable for only the crudest of applications. A well controlled waveform is essential for many short range sensor and radar imaging applications. If a transmitted radar waveform is still ringing when the receive antenna is trying to detect an echo, the ringing from the nearby transmit antenna will mask the echo received. Indeed, there exists a long standing need for an ultra wideband radar sensor for automotive applications in which it is conceived that the present invention will be implemented. In ultra wideband radar imaging applications, the ringing observed on the transmitted pulse smears the image contrast. In addition, many high speed electronic applications require clean, picosecond speed waveforms heretofore not available in the existing art such as a strobe generator for an ultra high speed sampling system.

The invention disclosed herein overcomes these limitations and completely damps ringing by judiciously choosing the values of inductance and diode capacitance per stage to control ringing. No resistors are used and the same CV profile holds for all diodes. The key to the invention lies in choosing the inductance-capacitance (LC) values appropriately to approximate a linear filter with a linear phase characteristic. In this sense, the invention is a compressive filter rather than a NLTL. The phase characteristic of the filter is typically designed to resemble that produced by a pure delay where phase is a function of frequency and delay. Such a linear filter or nonlinear equivalent filter also has no ringing. The invention described herein establishes the methodology long needed to convert a conventional linear phase LC filter to a varactor based Linear

Phase Compressive Filter (LPCF).

As a further improvement over the prior art, the layout of the invention herein produces ideal waveforms, adds no additional components and, on the other hand, generally reduces component numbers and values permitting a more compact implementation of a pulse filter which in turn facilitates conventional integrated circuit fabrication. Of particular significance is the fact that the invention is widely applicable to many forms of nonlinear transmission lines including magnetic shock lines.

SUMMARY OF THE INVENTION

Therefore, a principal object of the invention is to provide a Linear Phase Compressive Filter (LPCF) in place of a conventional NonLinear Transmission Line (NLTL), or Shock Line.

Another object of the invention is to provide a NLTL utilizing linear phase element values for the respective LC components.

Another object of the invention is to inhibit if not eliminate soliton ringing in a NLTL shock line by a laddered series of stages of low pass LC filters.

Another object is to incorporate at least one voltage dependent varactor diode in each low pass filter stage of a NLTL.

Another object is to mathematically predict and judiciously determine required inductance and capacitance values to completely damp soliton ringing.

Another object is to convert a nonlinear diode capacitance in a NLTL to an equivalent linear capacitance to enable applicability of linear network theory.

Yet another object is to eliminate need for any damping resistors in a NLTL.

Still another object is to maintain a similar capacitance-voltage profile for all diodes in a NLTL.

A further object is reduce total component number and value of prior art NLTL.

Still a further object is to provide a LPCF that is applicable to many forms of NLTLs.

The foregoing objects and advantages along with other less obvious benefits and features of the invention will become even more readily apparent upon viewing the attached drawing as interpreted by the following detailed description of a preferred embodiment along with and as circumscribed by the appended claims.

The invention is a Linear Phase Compressive Filter circuit and process consisting of a ladder or series of stages of low pass filters in which each stage is described by an inductor with a voltage dependent variable capacitor, varactor or PIN diode, to ground. The inductors and varactors are non-commensurate such that the values are accurately and independently established and made to correspond to a conventional phase-linear filter. The varactors are reverse biased such that each varactor initially presents a maximum capacitance that drops under a time constant $(LC)^{\frac{1}{2}}$ to a minimum, with the delay increasing for each stage causing the input pulse to be steepened and sharpened and concomitantly damping out entirely any soliton, or ringing effects traditionally associated with a shock line to produce an ideal waveform output.

DETAILED DESCRIPTION OF THE INVENTION

It is well understood in the art that various electronic low pass filter approximation processes and circuits exist such as Butterworth filters, Chebyshev filters, Elliptic filters, and, of course, the herein described and uniquely applied Linear Phase filters. So too, diode loaded NLTLs discussed in the background have long been in use. The novel orientation of this invention, however, is the unobvious application of a linear phase Filter to a NLTL shock line to eliminate soliton ringing caused by the nonlinear elements of the NLTL. To do so, the invention uses mathematically computed and empirically ascertained linear phase element values For the inductor and capacitor (LC) components of a typical NLTL to create a linear phase low pass Filter which totally filters out soliton ringing of the NLTL.

Figure 1:
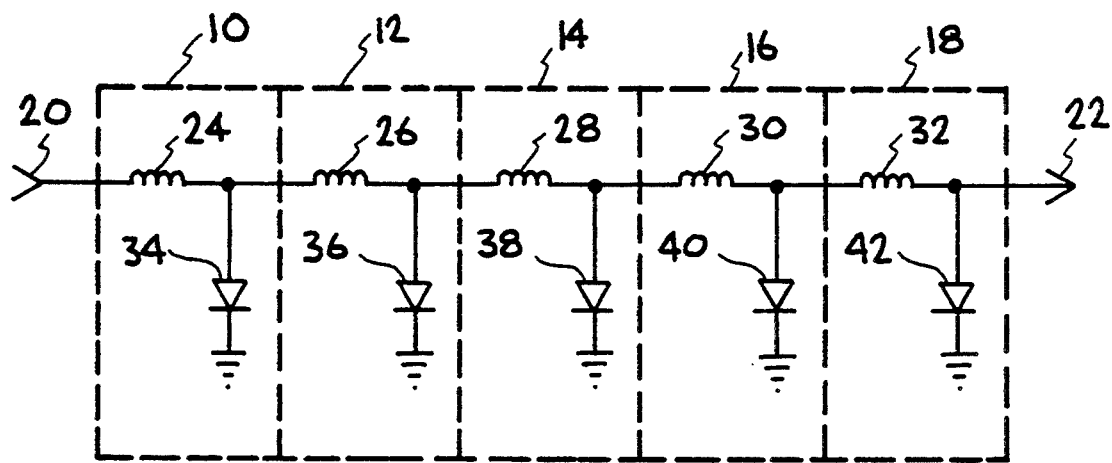
FIG. 1 illustrates a simple schematic of the Linear Phase Compressive Filter (LPCF).

Referring now to FIG. 1, an elementary schematic of the Linear Phase Compressive Filter invention is illustrated as a plurality of stages 10, 12, 14, and 18 coupled in series between an input 20 and an output 22. Each stage is provided with an inductor (L) 24, 26, 28, 30, and 32, and a corresponding varactor diode, PIN diode, or variable capacitor (C) 34, 36, 38, 40, and 42 to ground. It will be understood that the linear phase filter is not limited to the exact number of stages illustrated in FIG. 1, but may be any desired number lesser or greater than the five illustrated in FIG. 1.

It is conceived that the L and C values of FIG. 1 are non-commensurate such that the values correspond to a linear or conventional phase linear filter. Inductance L is fixed and constant for each stage; however, capacitance C value as applied in the NLTL varies and is mapped from a linear case using a large signal equivalent for a nonlinear case. For an abrupt junction diode, the large signal (ls) capacitance (C) is determined by the following equation:

$$\begin{aligned} C_{ls} &= \Delta Q/\Delta V \\ &= (1/V_{max}) \int_0^{V_{max}} [C_0/(1 + V/\phi)^m] dV \\ &= (2C_0\phi/V_{max})[(1 + V_{max}/\phi)^m + 1] \\ &= 2C_0(\phi/V_{max})^m \end{aligned}$$

Where:
Q=electronic charge on varactor diode
V=diode voltage
$C_o$=diode junction capacitance@$V_o$=0 (zero bias)
$\phi$=PN junction potential of the diode
$V_{max}$=max diode voltage
m=0.5 in a preferred embodiment but may vary
$V/\phi >> 1$ Applying the above formula and the following columnized procedure will yield necessary L and C values for a phase linear filter and a Linear Phase Compressive Filter (LPCF):

TABLE 1

| Linear Filter | | LPCF |
|---|---|---|
| $L_n$ | → | $L_n$ |
| $C_n$ | → | $C_{n(ls)}$ |
| Min Output R/T | → | Max Input R/T |

Where R/T refers to Rise Time and n refers to the LPCF element number. Otherwise stated, the maximum input risetime corresponds to the slowest input transition that will result in a maximally compressed output transition.

For purposes of illustration in specifically describing a particular embodiment of the invention, assume the LPCF design approximates a tenth order, linear phase Bessel filter. The LC component values can be computed from modern filter theory to yield normalized values (NV). The zero biased varactor diode capacitances for each respective numbered (n) capacitor $C_{o(n)}$ values are equated to $C_{is(n)}$ (scaled values in the LPCF from the above equation:

$$C_{o(n)} = C_{is(n)}/2(\phi/V_{max})^{\frac{1}{2}}$$

If one establishes $\phi=1$ and $V_{max}=100$ V, then $C_o=5\cdot C_{is}$ in this embodiment. Scaled values of C and L can be derived from normalized capacitance and inductance formulas as follows:

$$C_{n'} = C_n 2\pi f Z$$

$$L_{n'} = L_n Z/2\pi f$$

Where "f" is the filter cutoff frequency determined by f∼0.5/maximum input risetime and where Z is the input and output impedance defined by:

$$Z \sim (L_{(n)}/C_{is(n)})^{\frac{1}{2}}$$

TABLE 2

| $C_n$ or $L_n$ | NV | $C_{ls(n)}$ or $L_n$ | $C_o$ (n) |
|---|---|---|---|
| $C_{42}$ | 0.07 F | 0.11 pF | 0.80 pF |
| $C_{40}$ | 0.33 | 0.78 | 3.90 |
| $C_{38}$ | 0.55 | 1.33 | 6.67 |
| $C_{36}$ | 0.74 | 1.80 | 9.00 |
| $C_{34}$ | 1.08 | 2.62 | 13.10 |
| $L_{32}$ | 0.20 H | 0.9 nH | |
| $L_{30}$ | 0.44 | 2.0 | |
| $L_{28}$ | 0.65 | 2.9 | |
| $L_{26}$ | 0.86 | 3.9 | |
| $L_{24}$ | 2.26 | 10.4 | |

With the above established L and C values applied to the elements of FIG. 1, a LPCF of the type conceived by the invention is created. It should be understood that the LPCF is not reversible; the signal must flow in the direction indicated in FIG. 1. It should also be appreciated that the computed, scaled L and C values of Table 2 may be subject to small correction largely due to the nonlinear nature of a shock line.

Figure 2:
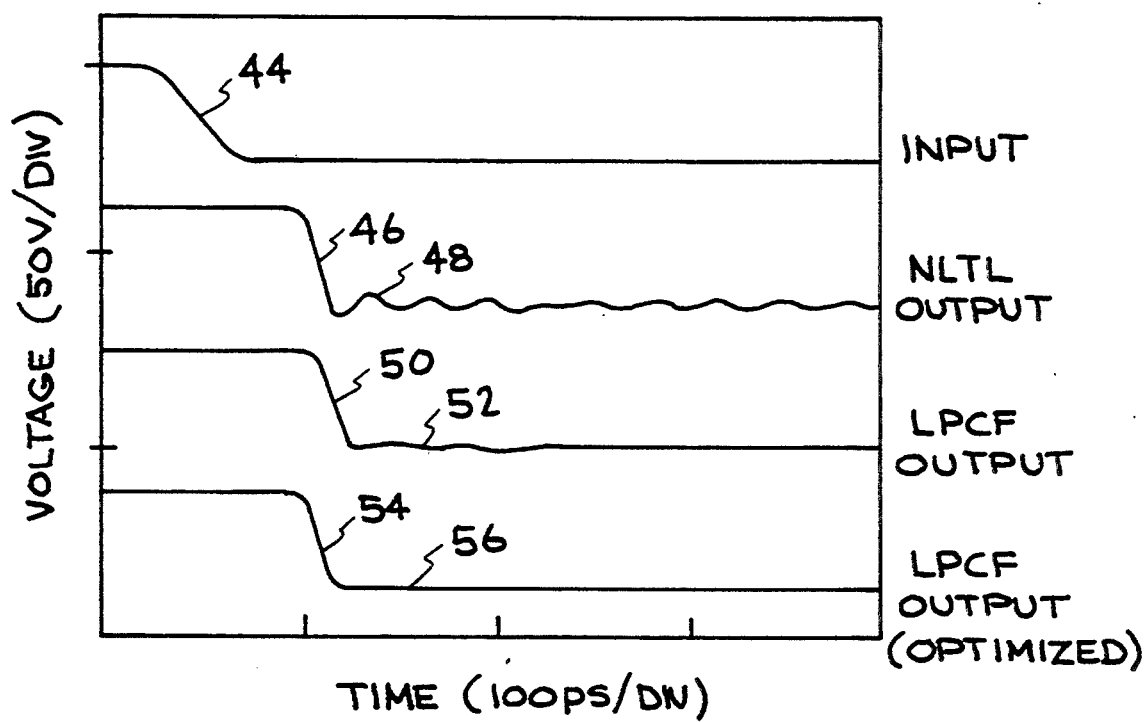
FIG. 2 is a graph indicating the LPCF improvement over a NLTL.

FIG. 2 depicts a four curve graph of voltage (V) versus time in picoseconds (ps) which clearly illustrates the improvement in the invention over the prior art. Curve 44 describes a typical long pulse input to be sharpened. Curve 46 describes a typical conventional NLTL sharpened output of curve 44 with inherent and undesired soliton ringing 48 customarily encountered therein. Curve 50 describes a linear phase compressive filter sharpened output of curve 44 and with essentially nominal or no ringing 52. It can be appreciated that a substantial improvement over the prior art is achieved in eliminating undesirable ringing normally encountered in a NLTL. Curve 54 illustrates the output of an ideal LPCF obtained by the application of small, optimized correction factors applied to respective L and C component values as indicated in the following Table 3. The correction values of Table 3 are necessary due to the nonlinear nature of shock lines in general. From a calculated value, a simulated optimized value is determined to which an optimized correction factor is applied.

TABLE 3

| $C_n$ or $L_n$ | Calculated | Optimized | Factor |
|---|---|---|---|
| $C_{42}$ | 13.1 pF | 12.76 pF | 0.974 |
| $C_{40}$ | 9.0 | 7.74 | 0.860 |
| $C_{38}$ | 6.7 | 5.10 | 0.760 |
| $C_{36}$ | 3.9 | 3.17 | 0.810 |
| $C_{34}$ | 0.8 | 1.54 | 1.925 |
| $L_{32}$ | 10.4 nH | 9.24 nH | 0.888 |
| $L_{30}$ | 3.9 | 3.87 | 0.992 |
| $L_{28}$ | 2.9 | 2.55 | 0.879 |
| $L_{26}$ | 2.0 | 1.67 | 0.835 |
| $L_{24}$ | 0.9 | 0.86 | 0.988 |

TABLE 3-continued

The foregoing factors may be applied to the respective $C_{o(n)}$ and $L_{(n)}$ values of Table 2 to obtain an ideal and optimized curve 54 and 56 of FIG. 2. In general, the end component values deviate the most and represent end terminating sections. The ratio of optimized/calculated values can be used as a design guide for longer lines of LC stages.

Although the invention herein above disclosed has been described in detail with reference to a particular example of an embodiment, persons possessing skill in the art to which this invention pertains will appreciate that various modifications and enhancements can be made without departing from the spirit and scope of the invention as defined and limited only by the following appended claims.

I claim:

1. A linear phase compressive filter, comprising;

a plurality of stages coupled in series, wherein said stages have an input terminal and an output terminal;

each stage of said plurality of stages comprising at least one inductive element (L) in series with said stages and at least one variable capacitive element (C) coupled to ground, wherein said at least one inductive element is electrically connected between said input terminal and said output terminal, wherein said C is electrically connected between said L and said ground, wherein said C is a voltage dependent element having a capacitance that is inversely proportional to a voltage applied thereto; and wherein said L and said C have values that are non-commensurate in each said stage, wherein per stage said non-commensurate L values and said non-commensurate C values have a linear phase orientation, wherein there is a linear phase relationship along said plurality of stages, wherein said C has a value determined from the formula:

$$C_{ls} = (1/V_{max}) \int_0^{V_{max}} [C_o/(1 + V/\phi)^m] dV,$$

wherein said C value is mathematically mapped in each said stage to said linear orientation from a large scale (ls) equivalent C value of a nonlinear transmission line, wherein said L value in each stage is mapped to said linear relationship directly from an L value of a corresponding linear phase filter, wherein said linear phase compressive filter compresses transmission time of a pulse 2. A linear phase compressive filter according to claim 1, wherein said voltage dependent element is a reverse biased PN junction, wherein said reversed biased PN junction comprises a reverse bias voltage applied to said variable capacitive element.

3. A linear phase compression filter according to claim 2, wherein said reverse biased PN junction is a varactor diode.

4. A method for filtering a shock pulse in a transmission line to eliminate soliton ringing, comprising the steps of:

forming a ladder of filter stages, each stage of said ladder of filter stages having an inductive element (L) in series with an adjacent stage and a capacitive element (C) coupled to ground, wherein each said stage has an input terminal and an output terminal, wherein said L is electrically connected between said input terminal and said output terminal, wherein said C is electrically connected between said L and ground, wherein said C is a voltage dependent element such that it has a capacitance that is inversely proportional to a voltage applied thereto;

making said capacitive element in each said stage variably dependent on voltage applied thereto; and establishing ideal L and C values in said ladder of filter stages to effect a linear phase relationship in said transmission line, wherein said C value in each said stage is mapped to said linear phase relationship by correlating said value with a large scale (ls) equivalent C value in a nonlinear transmission line according to the following formula:

$$C_{ls} = (2C_o/V_{max})[(1+V_{max}/\phi)^1 + 1],$$

wherein said L value in each said stage is mapped to said linear relationship directly from an L value of a corresponding linear phase filter.

5. A linear phase compressive filter for eliminating soliton ringing in a transmission line, comprising:

means for establishing a plurality of series coupled non-commensurate stages, each stage of said series coupled non-commensurate stages having respective inductive (L) and capacitive (C) elements, wherein each said stage has an input terminal and an output terminal, wherein said L is electrically connected between said input terminal and said output terminal, wherein said C is electrically connected between said L and ground, wherein said C is a voltage dependent element such that it has a capacitance that is inversely proportional to a voltage applied thereto;

means for varying at least one said C element of at least one said stage;

wherein linear phase element values are established for said L and C elements of at least one said stage with respect to at least one other said stage, wherein said C value in each respective stage is mapped to a phase linear relationship by determining said value from a large scale (ls) equivalent C value in a corresponding linear phase filter, wherein Said C element value is obtained from the formula:

$$C_{ls} = 2C_o(\phi/V_{max})^{\frac{1}{2}} \text{ for } V/\phi >> 1,$$

wherein said linear phase element value for said L element is determined by mapping said L value in each respective stage directly from a corresponding L value of a linear phase filter.

6. A linear phase compressive filter according to claim 5, wherein said non-commensurate stages are pulse compressive filters with series coupled inductive elements and a capacitive elements coupled to ground.

7. A linear phase compressive filter according to claim 6, wherein said capacitive elements are variable capacitors.

8. A linear phase compressive filter according to claim 7, wherein said variable capacitors are reverse biased PN junctions, wherein said reversed biased PN junction comprises reverse bias voltage applied to said variable capacitive element.

9. A linear phase 1 compressive filter according to claim 8, wherein said reverse biased capacitors are reverse biased varactor diodes.

10. The method of claim 4, wherein the forming step includes forming a ladder of filter stages, each stage of said ladder of filter stages having an inductive element (L) in series with an adjacent stage and a capacitive element (C) coupled to ground, wherein said C is selected from a group consisting of a varactor diode, a PIN diode and a variable capacitor.

11. The method of claim 4, wherein the step of establishing ideal L and C values includes making corrections to said ideal L and C values due to the nonlinear nature of a shock line.

* * * * *